United States Patent [19]

Ha

[11] Patent Number: 5,554,547

[45] Date of Patent: Sep. 10, 1996

[54] PROCESS FOR THE PRODUCTION OF THIN FILM TRANSISTOR USING OXYGEN PLASMA

[75] Inventor: Hyoung C. Ha, Seoul, Rep. of Korea

[73] Assignee: Hyundai Electronics Industries Co., Ltd., Rep. of Korea

[21] Appl. No.: 380,993

[22] Filed: Jan. 31, 1995

Related U.S. Application Data

[63] Continuation of Ser. No. 127,969, Sep. 28, 1993, abandoned.

[30] Foreign Application Priority Data

Sep. 29, 1992 [KR] Rep. of Korea .................. 92-17794

[51] Int. Cl.$^6$ .................. H01L 21/84; H01L 21/336
[52] U.S. Cl. .................. 437/40; 437/101
[58] Field of Search .................. 437/21, 40, 41, 437/101, 909

[56] References Cited

U.S. PATENT DOCUMENTS

| | | | |
|---|---|---|---|
| 4,741,919 | 5/1988 | Takasaki | 427/38 |
| 5,047,360 | 9/1991 | Nicholas | 437/40 |
| 5,064,775 | 11/1991 | Chang | 437/40 |
| 5,114,869 | 5/1992 | Tanaka et al. | 437/40 |
| 5,141,885 | 8/1992 | Yoshida et al. | 437/41 |
| 5,250,444 | 10/1993 | Khan et al. | 437/24 |
| 5,372,958 | 12/1994 | Miyasaka et al. | 437/40 |

*Primary Examiner*—Mary Wilczewski
*Assistant Examiner*—Richard A. Booth
*Attorney, Agent, or Firm*—Popham, Haik, Schnobrich & Kaufman, Ltd.

[57] ABSTRACT

A process for producing a thin film transistor suitable to a high integrated static ram (SRAM) or a liquid crystal display, thereby improvements in a leak current and an operating current along with a process for the production of a thin film transistor. The process comprises treating a channel polysilicon layer of a TFT structure with oxygen plasma to eliminate the drawbacks generated in an interface between the channel polysilicon layer and a gate insulating film and in the channel polysilicon layer itself. There may be a reduced leak current when switching off the TFT as well as an increased operating current when switching on the TFT. Accordingly, in accordance with the present invention, the characteristics of TFT is greatly improved.

2 Claims, 3 Drawing Sheets

PROCESS FOR THE PRODUCTION OF THIN FILM TRANSISTOR USING OXYGEN PLASMA

This is a continuation of U.S. patent application Ser. No. 08/127,969, filed Sep. 28, 1993 now abandoned.

BACKGROUND OF THE INVENTION

1. Field of the Invention

The present invention relates in general to a process for producing a thin film transistor suitable to a high integrated static ram (SRAM) or a liquid crystal display, and more particularly to improvements in leak current and an operating current along with a process for the production of a thin film transistor.

2. Description of the Prior Art

Generally, there occurs a leak current in a thin film transistor (hereinafter "TFT"), which is widely used for operating a liquid crystal display or a SRAM. For example, high temperature treatment has been recently applied to the production of TFT to form an oxide film therein. However, the high temperature treatment causes a leak current to increase in a produced TFT.

In the meanwhile, in the ordinary TFT producing method, following depositing a channel polysilicon layer on a substrate, a gate insulating film is formed on the channel polysilicon layer without applying oxidation treatment to the layer. In this case, there occur drawbacks in an interface between the channel polysilicon layer and the gate insulating film and in the channel polysilicon layer itself, causing to deteriorate the functions of the TFT.

SUMMARY OF THE INVENTION

Therefore, in view of the above noted problems and drawbacks of the prior art, an object of the invention is to provide a process for the production of TFT, which comprises treating a channel polysilicon layer of a TFT structure with oxygen plasma to eliminate the drawbacks generated in an interface between the channel polysilicon layer and a gate insulating film and in the channel polysilicon layer itself.

In a preferred embodiment of this invention, the above object can be accomplished by providing a process for producing a TFT, comprising the steps of forming a gate electrode on an insulating substrate, depositing a gate insulating film entirely, forming a channel polysilicon layer on the gate insulating film, applying oxygen plasma treatment to the channel polysilicon layer, and implanting impurities into the resulting channel polysilicon layer to form a source region and a drain region.

In a second embodiment of the present invention, there is provided a process for the production of TFT, comprising forming a channel polysilicon layer on an insulating substrate, applying oxygen plasma treatment to the channel polysilicon layer, depositing a gate insulating film on the channel polysilicon layer, forming a gate electrode on the gate insulating film, and implanting impurities having a type different from the channel polysilicon layer into the resulting channel polysilicon layer to form a source region and a drain region, whereby, drawbacks can be reduced in an interface between the channel polysilicon layer and the gate insulating film and in the channel polysilicon layer itself.

The above and other objects and advantages of the present invention will become more apparent as the following description proceeds.

To the accomplishment of the foregoing and related ends, the invention, then, comprises the features hereinafter fully described in the specification and particularly pointed out in claims, the following description and the annexed drawing setting forth in detail a certain illustrative embodiment of the invention, this being indicative, however, of but one of the various ways in which the principles of the invention may be employed.

DETAILED DESCRIPTION OF THE PREFERRED EMBODIMENTS

Figure 1:
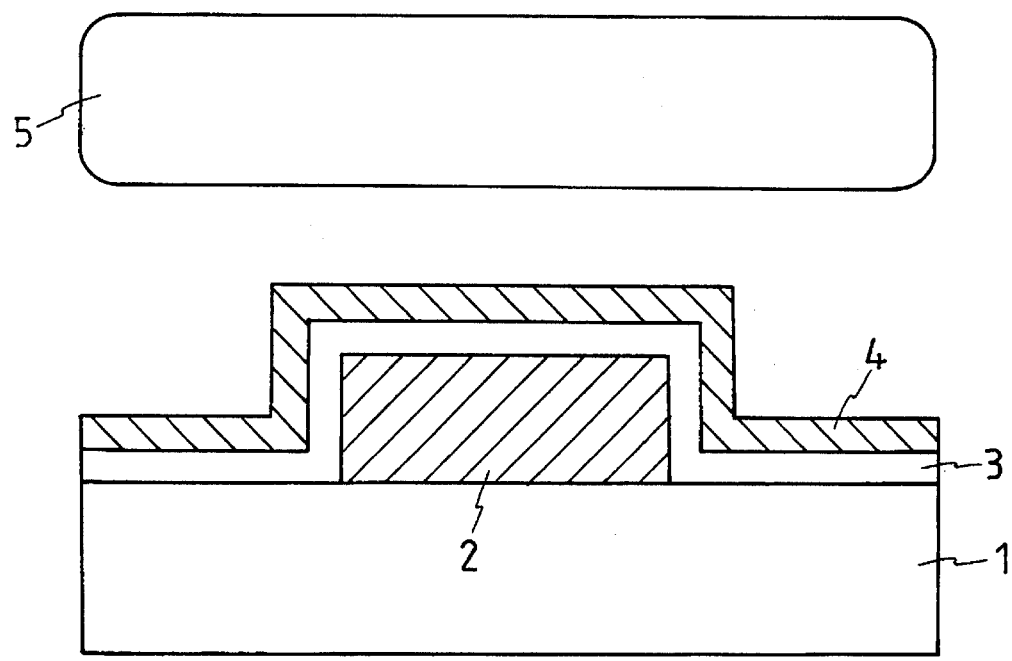
FIG. 1 is a sectional view illustrating a process for producing a TFT according to a first embodiment of the invention.

Hereinafter, the description is given in detail for the process for the production of TFT according to the present invention. First, referring to FIG. 1 in which a bottom gate structure is shown, the description is given up to treatment for a channel polysilicon layer with oxygen plasma. As shown in FIG. 1, the bottom gate structure for TFT is formed on an insulating substrate 1, which is mounted with a gate electrode 2 of polysilicon covered entirely with a gate insulating film 3. A channel polysilicon layer 4 is formed on the gate insulating film 3 and then treated with oxygen plasma to oxidize a part of its own. As a result, there is formed a thin oxide film (not shown) which allows a drawback to be reduced in an interface between the channel polysilicon layer 4 and the gate insulating 3 and in the channel polysilicon layer itself. Herein, besides the $O_2$ plasma, plasma including an oxygen atom, such as $N_2O$ plasma and the like may be used.

Figure 2:
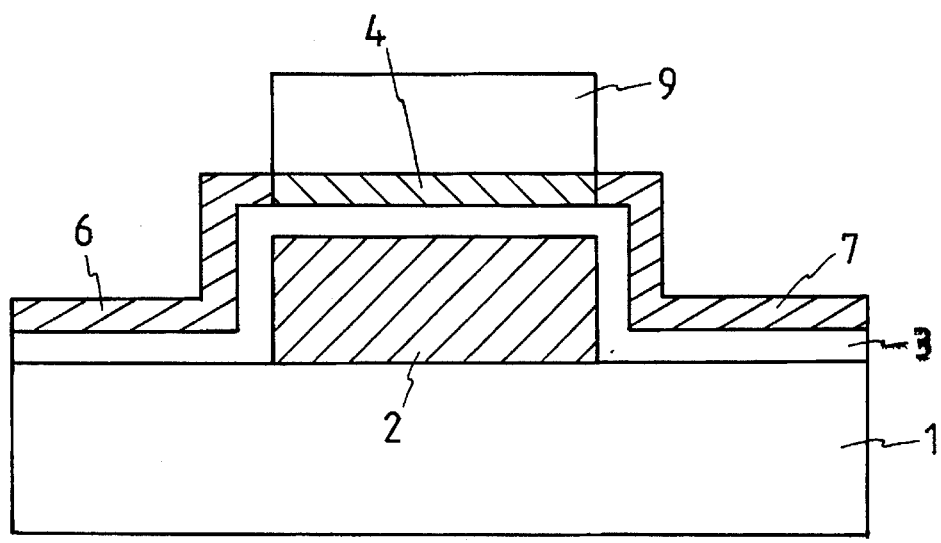
FIG. 2 is a likewise sectional view illustrating the process for producing the TFT.

Subsequent steps will be described with reference to FIG. 2. Firstly, a photosensitive film 9 is formed on the surface of the channel polysilicon layer 4 and patterned in a desired shape as a mask. Thereafter, using the mask, impurities having a type different to that in the channel polysilicon layer 4 is ion-implanted in the channel polysilicon layer to form a source region and a drain region 7. The polysilicon of the layer 4 may be substituted with amorphous silicon or other type silicon.

Figure 3:
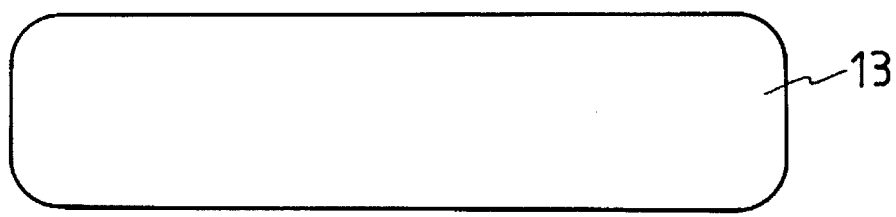
FIG. 3 is a sectional view illustrating a process for producing a TFT according to a second embodiment of the invention.
Figure 3:
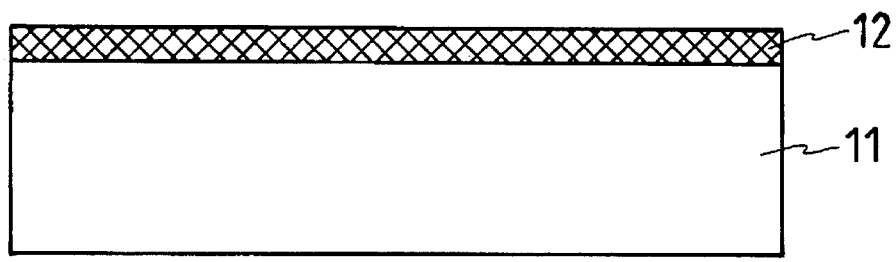
Figure 4:
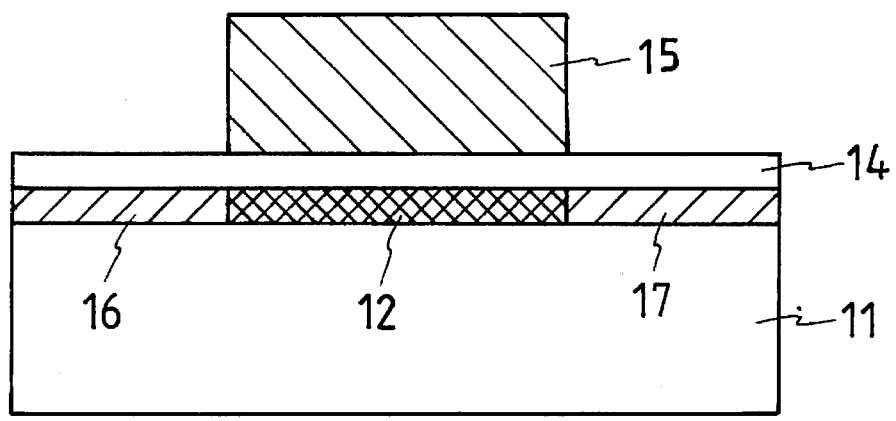
FIG. 4 is a likewise sectional view illustrating the process for producing the TFT.

Turning now to FIG. 3, there is illustrated a process flow for a top structure for TFT according to a second embodiment of the invention.

First, the top structure is made of an insulating substrate 11 on which a channel polysilicon layer 12 is formed. Following this, the channel polysilicon layer 12 is treated with oxygen plasma 13 to oxidize a part of its own.

The top structure for TFT is finished by employing the steps which will hereinafter be described in detail with reference to FIG. 3.

Initially, a gate insulating film 14 is deposited on the channel polysilicon layer 12. Next, a gate electrode 15 is formed on the gate insulating film 14. Lastly, impurities having a type different from that in the channel polysilicon layer 12 is ion-implanted in the channel polysilicon layer to form a source region 16 and a drain region 17.

As a result of the treatment with oxygen plasma, there is formed a thin oxide film (not shown) which allows a drawback to be reduced in an interface between the channel polysilicon layer 12 and the gate insulating 14 and in the channel polysilicon layer itself.

Figure 5:
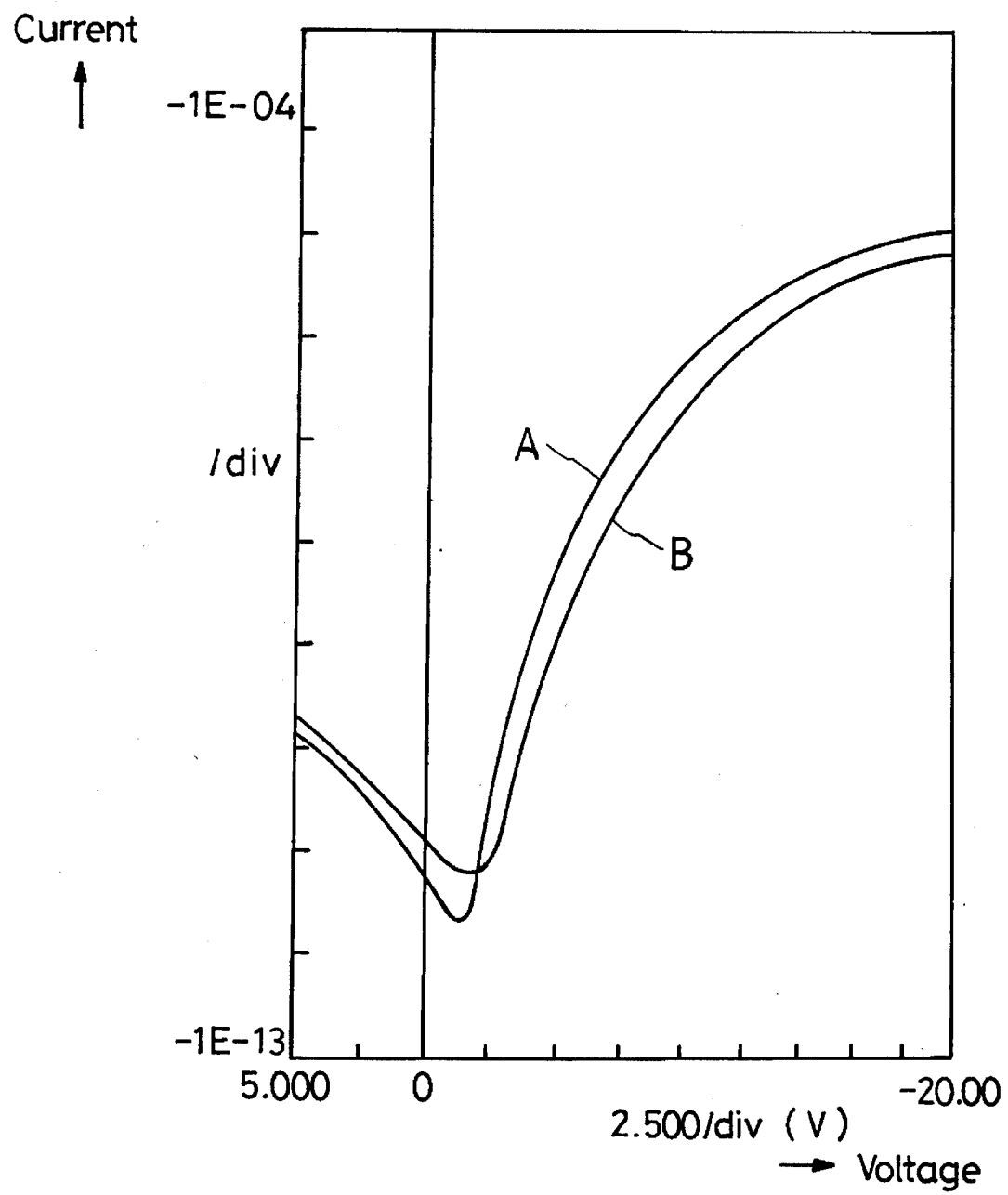
FIG. 5 is a graph illustrating the relation between a voltage and a current in the inventive TFT and in a conventional TFT.

The inventive features are illustrated in FIG. 5 in comparison between the process of the invention and a conventional process. Namely, while A curve is plotted by currents with respect to voltages representing the case in that the oxygen plasma treatment is applied to the channel polysilicon layer, while B curve is plotted representing that the oxygen plasma treatment is not applied to the channel polysilicon layer. As shown in the figure, a leak current of A curve is lower than that of B curve in the Off-region. On the contrary, an operating current of A curve is higher than that of B curve in the operating region.

As explained above, in the TFT according to the present invention, a part of the channel polysilicon layer is oxidized by using oxygen plasma, so that a leak current may be reduced when switching off the TFT as well as an increased operating current when switching on the TFT. Accordingly, in accordance with the present invention, the characteristics of TFT is greatly improved.

What is claimed is:

1. A process for producing a thin film transistor, which comprises the steps of:

(a) forming a gate electrode on an insulating substrate;

(b) following said step (a), depositing an insulating film over said insulating substrate and said gate electrode;

(c) following said step (b), forming a channel silicon layer on the insulating film;

(d) following said step (c), applying oxygen plasma treatment to the channel silicon layer to form an oxidized layer between said channel silicon layer and said insulating film, said oxidized layer reducing both defects in said channel silicon layer and defects in an interface between said channel silicon layer and said insulating film; and (e) following said step (d), implanting impurities into the resulting channel silicon layer to form a source region and a drain region.

2. A process according to claim 1, wherein said channel silicon layer includes at least one of: amorphous silicon and polysilicon.

* * * * *